(12) United States Patent
Kim et al.

(10) Patent No.: US 8,841,150 B2
(45) Date of Patent: Sep. 23, 2014

(54) ARRAY SUBSTRATE FOR FLEXIBLE DISPLAY DEVICE AND METHOD OF MANUFACTURING THE ARRAY SUBSTRATE

(71) Applicant: Samsung Display Co., Ltd., Yongin (KR)

(72) Inventors: Dong-Ho Kim, Yongin (KR); Sung-Un Park, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 13/747,863

(22) Filed: Jan. 23, 2013

(65) Prior Publication Data
US 2014/0097429 A1    Apr. 10, 2014

(30) Foreign Application Priority Data
Oct. 9, 2012    (KR) .................. 10-2012-0112082

(51) Int. Cl.
*H01L 21/46*    (2006.01)
*H01L 33/52*    (2010.01)
*H01L 27/15*    (2006.01)

(52) U.S. Cl.
CPC .............. *H01L 33/52* (2013.01); *H01L 27/15* (2013.01)
USPC .................. 438/33; 438/34; 438/42; 438/462

(58) Field of Classification Search
USPC ........................ 438/33, 34, 42, 462
See application file for complete search history.

(56) References Cited

U.S. PATENT DOCUMENTS

| 6,037,191 | A | * | 3/2000 | Honda et al. ............ 438/114 |
| 7,968,882 | B2 | | 6/2011 | Lee et al. |
| 8,525,218 | B2 | * | 9/2013 | Suenaga .............. 257/99 |
| 8,679,870 | B2 | * | 3/2014 | Kataoka et al. ......... 438/26 |
| 2013/0056781 | A1 | * | 3/2013 | Suenaga .............. 257/98 |
| 2013/0299864 | A1 | * | 11/2013 | Sugizaki et al. ......... 257/98 |
| 2013/0320381 | A1 | * | 12/2013 | Kojima et al. .......... 257/98 |

FOREIGN PATENT DOCUMENTS

| KR | 10-2009-0121894 A | 11/2009 |
| KR | 10-2011-0116776 A | 10/2011 |
| KR | 10-2011-0133881 A | 12/2011 |
| KR | 10-2012-0009617 A | 2/2012 |

* cited by examiner

*Primary Examiner* — Ngan Ngo
(74) *Attorney, Agent, or Firm* — Knobbe Martens Olson & Bear LLP (57) ABSTRACT

In an aspect, an array substrate for a flexible display device and a method of manufacturing the array substrate, the method including operations of arranging at least one lower protective film on which a plurality of display units that are covered by thin-film encapsulation (TFE) units are arrayed; performing half cutting and full cutting on the at least one lower protective film; and completing the manufacture of each of the plurality of display units by removing remaining parts on the at least one lower protective film from the half cutting and full cutting is provided.

17 Claims, 6 Drawing Sheets

ARRAY SUBSTRATE FOR FLEXIBLE DISPLAY DEVICE AND METHOD OF MANUFACTURING THE ARRAY SUBSTRATE

CROSS-REFERENCE TO RELATED APPLICATION

This application claims priority to and the benefit of Korean Patent Application No. 10-2012-0112082, filed in the Korean Intellectual Property Office on Oct. 9, 2012, the disclosure of which is incorporated herein by reference in its entirety.

BACKGROUND

1. Field

The described technology generally relates to an array substrate, and more particularly, to an array substrate for a flexible display device in which an edge crack of a flexible display unit is prevented, and a method of manufacturing the array substrate.

2. Description of the Related Technology

In general, flat display devices are typically classified into a light-emitting type display device and a light-receiving type display device. Examples of the light-emitting type display device include an organic light-emitting display device, a plasma display panel (PDP), a flat cathode ray tube (FCRT), a vacuum fluorescent display panel (VFD), a light emitting diode (LED) panel, or the like. An example of the light-receiving type display device includes a liquid crystal display (LCD) panel.

Among the flat display devices, organic light-emitting display devices are advantageous in that they have wide viewing angles, an excellent contrast ratio, and high response speeds. Accordingly, the organic light-emitting display devices are highlighted for application to display devices for mobile devices such as a digital camera, a video camera, a camcorder, a portable information terminal, a smart phone, an ultra-slim notebook, a table personal computer, or the like or electronic/electric appliances, such as ultra-thin TVs.

Recently, flexible display devices have been studied and developed as next-generation display devices for certain applications in that they are easilied carried and may be applied devices having various shapes.

For efficiency, a flexible display device may be manufactured by forming a plurality of display devices on a mother substrate and cutting the plurality of display devices into individual display devices with a cutting tool. The flexible display device may include a flexible substrate having a hardness that is lower than a hardness of a glass substrate having rigidity.

Thus, in the manufacturing method including a cutting process, cracks may occur in the flexible display device due to equipment stress or due to an external force by a worker. In general, the cracks occur in the manufacturing method when the flexible display device contacts a surface of a stage while the flexible display device is mounted on the stage, or when a worker handles the flexible display device for a test.

When the cracks occur in the flexible display device, a film of a thin-film encapsulation (TFE) unit that covers a display unit may be damaged, and thus, foreign moisture may penetrate into the flexible display device. Thus, the flexible display device has a defect that may cause a problem with non-lighting or the like.

SUMMARY

The present embodiments provide an array substrate for a flexible display device in which incidence of an edge crack, that occurs when a plurality of flexible display units on a mother substrate are individually divided, is decreased. Some embodiments provide a method of manufacturing the array substrate.

Some embodiments provide a method of manufacturing an array substrate for a flexible display device, the method including operations of arranging at least one lower protective film, wherein a plurality of display units that are covered by thin-film encapsulation (TFE) units are arrayed on the at least one lower protective film; performing half cutting and full cutting on the at least one lower protective film to provide remaining parts on the at least one lower protective film; and removing the remaining parts on the at least one lower protective film from the half cutting and full cutting.

In some embodiments, the operation of arranging the at least one lower protective film may include an operation of arranging a first lower protective film on which the plurality of display units are arrayed and a second lower protective film that is attached to the first lower protective film by using an adhesion layer.

In some embodiments, the method may further include operations of arraying the plurality of display units at regular intervals on the first lower protective film, wherein each of the plurality of display units includes a display region and a non-display region; and forming a plurality of testing wires in a wire region between adjacent display units of the plurality of display units, wherein the plurality of testing wires are electrically connected to the adjacent display units, respectively.

In some embodiments, the operation of performing the half cutting and full cutting may include operations of performing the half cutting along a half cutting line whereby the plurality of display units are individually divided along edges of the plurality of display units; and performing the full cutting along a full cutting line in the wire region between the adjacent display units.

In some embodiments, the half cutting may be performed from a top surface of each of the plurality of display units to a bottom surface of the first lower protective film in a half-cut region, and the full cutting may be performed from a top of the plurality of testing wires to a bottom surface of the second lower protective film in a full-cut region.

In some embodiments, the full cutting line may overlap with the plurality of testing wires, and the half cutting line may cross a portion of the plurality of testing wires.

In some embodiments, the operation of arranging the at least one lower protective film may further include an operation of arranging a first upper protective film that is arranged on a top surface of the plurality of display units which is in an opposite direction to the at least one lower protective film, and a second upper protective film that is attached to the first upper protective film by using an adhesion layer.

In some embodiments, the method may further include operations of arraying the plurality of display units at regular intervals on the at least one lower protective film, wherein each of the plurality of display units includes a display region and a non-display region; forming a plurality of testing wires in a wire region between adjacent display units of the plurality of display units, wherein the plurality of testing wires are electrically connected to the adjacent display units, respectively; attaching the first upper protective film to the top surface of the plurality of display units covered by the TFE units; and attaching the second upper protective film to a top surface of the first upper protective film.

In some embodiments, the operation of performing the half cutting and full cutting may include operations of performing the half cutting along a half cutting line whereby the plurality of display units are individually divided along edges of the plurality of display units; and performing the full cutting along a full cutting line in the wire region between the adjacent display units.

In some embodiments, the half cutting may be performed from a top surface of the at least one lower protective film to the top surface of the first upper protective film, and the full cutting may be performed from the top surface of the at least one lower protective film to a bottom surface of the second upper protective film.

In some embodiments, the full cutting line may overlap with the plurality of testing wires, and the half cutting line may cross a portion of the plurality of testing wires.

Some embodiments provide an array substrate for a flexible display device, the array substrate including at least one lower protective film; a plurality of display units arrayed at regular intervals on the at least one lower protective film, wherein each of the plurality of display units includes a display region for displaying an image and a non-display region extending from the display region to an edge of each of the plurality of display units; a thin-film encapsulation (TFE) unit covering the display region of each of the plurality of display units; and a plurality of testing wires formed in a wire region between adjacent display units of the plurality of display units, wherein the plurality of testing wires are electrically connected to the adjacent display units, respectively, wherein the at least one lower protective film includes a first lower protective film on which the plurality of display units are arrayed, and a second lower protective film that is attached to the first lower protective film by using an adhesion layer and that is configured to be selectively removed.

In some embodiments, each of the plurality of display units may include a flexible substrate formed on the at least one lower protective film; a thin-film transistor (TFT) formed on the flexible substrate, the TFT including a semiconductor active layer, a gate electrode, source and drain electrodes, and a plurality of insulating layers for insulating the semiconductor active layer, the gate electrode, the source and drain electrodes from each other; and an organic light-emitting device (OLED) connected to the TFT, the OLED including a first electrode, a second electrode, and an organic layer formed between the first electrode and the second electrode.

In some embodiments, the array substrate may further include a buffer layer; a gate insulating layer; and an interlayer insulating layer, wherein the plurality of insulating layers may include a first insulating layer that is formed on the flexible substrate, wherein the first insulating layer corresponds to the buffer layer; a second insulating layer that covers the semiconductor active layer formed on the first insulating layer, wherein the first insulating layer corresponds to the gate insulating layer; and a third insulating layer that covers the gate electrode formed on the second insulating layer, wherein the third insulating layer corresponds to the interlayer insulating layer, wherein at least one of the first insulating layer, the second insulating layer, and the third insulating layer extends from the display region of each of the plurality of display units to the wire region.

Some embodiments provide an array substrate for a flexible display device, the array substrate including a lower protective film; a plurality of display units arrayed at regular intervals on the lower protective film, wherein each of the plurality of display units includes a display region for displaying an image and a non-display region extending from the display region to an edge of each of the plurality of display units; a thin-film encapsulation (TFE) unit covering the display region of each of the plurality of display units; and an upper protective film formed on the plurality of display units, wherein the upper protective film comprises a first upper protective film that is formed on the plurality of display units covered by a plurality of the TFE units, and a second upper protective film that is attached to the first upper protective film by using an adhesion layer.

BRIEF DESCRIPTION

The above and other features and advantages of the present embodiments will become more apparent by describing in detail exemplary embodiments thereof with reference to the attached drawings in which:

FIGS. 3A through 3D illustrate a process of forming individual display units, according to an aspect of the present embodiments, FIGS. 4A through 4D illustrate a process of forming individual display units, according to another embodiment of the present invention.

DETAILED DESCRIPTION

The present embodiments will now be described more fully with reference to the accompanying drawings, in which exemplary embodiments are shown. The invention may be embodied in many different forms, and should not be construed as being limited to the embodiments set forth herein. Thus, the invention may include all revisions, equivalents, or substitutions which are included in the concept and the technical scope related to the present embodiments.

While such terms as "first", "second", etc., may be used to describe various components, such components must not be limited to the above terms. The above terms are used only to distinguish one component from another.

The terms used in the present specification are merely used to describe particular embodiments, and are not intended to limit the present embodiments. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Hereinafter, exemplary embodiments of the present embodiments will be described in detail with reference to the attached drawings Like reference numerals in the drawings denote like elements and detailed descriptions thereof are omitted here.

As used herein, the term "and/or" includes any and all combinations of one or more of the associated listed items.

Expressions such as "at least one of," when preceding a list of elements, modify the entire list of elements and do not modify the individual elements of the list.

Figure 1:
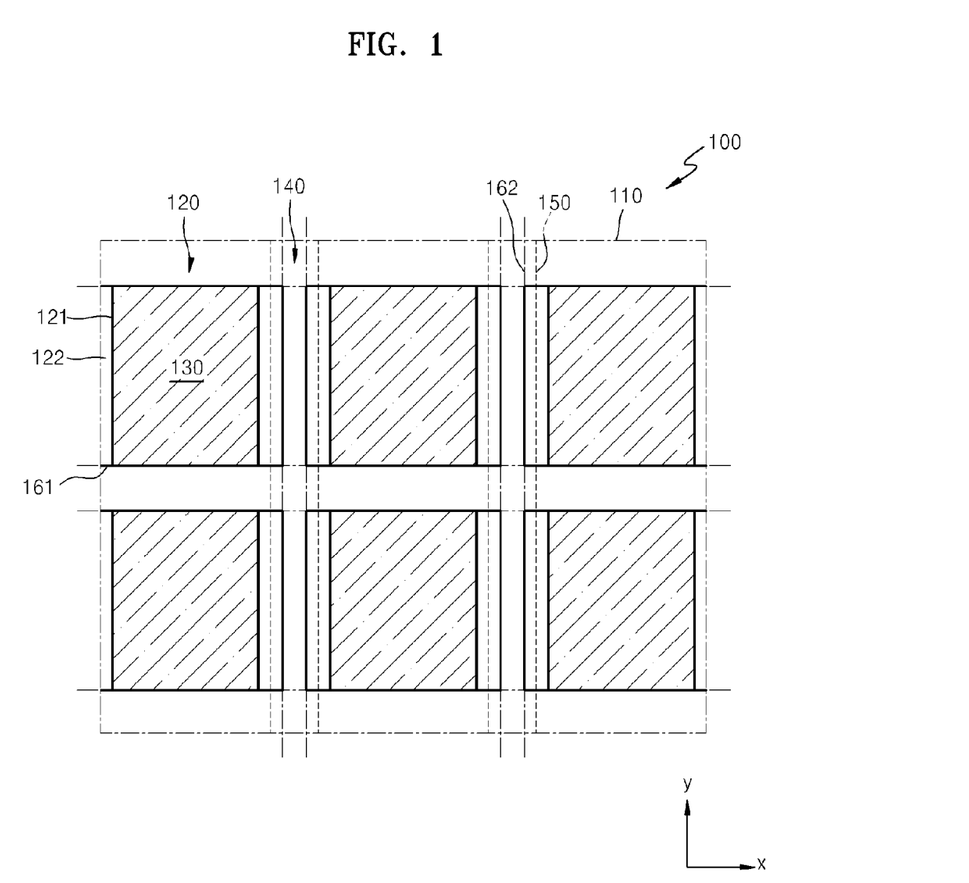
FIG. 1 illustrates an array substrate for a flexible display device according to an aspect of the present embodiments.

FIG. 1 illustrates an array substrate 100 for a flexible display device according to an aspect of the present embodiments.

Referring to FIG. 1, the array substrate 100 includes a mother substrate 110, a plurality of display units 120 formed on the mother substrate 110, thin-film encapsulation (TFE) units 130 formed respectively on the display units 120, and a plurality of testing wires 150 patterned on the mother substrate 110.

In some embodiments, the mother substrate 110 may be a flexible film, such as a protective film, formed of a polymer resin. In some embodiments, the mother substrate 110 may have a sufficient thickness to support a shape of the display units 120 that are thin-film layers. In some embodiments, the mother substrate 110 may have a size by which the display units 120 may be simultaneously manufactured.

In some embodiments, the display units 120 may be arrayed at regular intervals on the mother substrate 110. In some embodiments, the display units 120 may be individually separated to function as display devices, respectively. In some embodiments, the display units 120 that are simultaneously formed on the mother substrate 110 may be individually separated by using a cutting tool.

In some embodiments, each of the display units 120 corresponds to an organic light-emitting display unit, but the display unit 120 may also be applied to different types of display units, such as a liquid crystal display (LCD) unit, a field emission display device, an electroluminescent display unit, an electrophoretic display unit, or the like.

In some embodiments, the display unit 120 may be divided into a display region 121 that realizes an image, and a non-display region 122 that extends from the display region 121 to an edge of the display unit 120. Devices or thin-film layers formed in the display region 121 will be described in detail with reference to FIG. 2.

The TFE unit 130 that covers the display region 121 is formed on the display unit 120. The TFE unit 130 prevents exterior moisture or foreign substances from penetrating into the display region 121. In some embodiments, the TFE unit 130 may be formed on an entire surface of the mother substrate 110. In some embodiments, it is preferable that the TFE unit 130 is selectively formed on corresponding regions of the display units 120, respectively. In some embodiments, the TFE unit 130 may be formed via a deposition process using a deposition mask.

The testing wires 150 are patterned in a wire region 140 between the display units 120 that are adjacent to each other. In some embodiments, the testing wires 150 are electrically connected to the display units 120 to test whether the display units 120 are normally turned on.

The testing wires 150 are disposed in one direction (e.g., a Y-axis direction) of the mother substrate 110. In some embodiments, the testing wires 150 may be disposed in the Y-axis direction of the mother substrate 110. However, aspects of the present embodiments are not limited thereto and the testing wires 150 may extend in an X-axis direction of the mother substrate 110 or may simultaneously extend in the X-axis and Y-axis directions of the mother substrate 110, i.e., a structure of the testing wires 150 is not limited to the aforementioned as long as the testing wires 150 are electrically connected to the plurality of display units 120, respectively.

In some embodiments, each of the testing wires 150 may be drawn as one whole wire but may be formed as a plurality of wires along one direction of the mother substrate 110.

Figure 2:
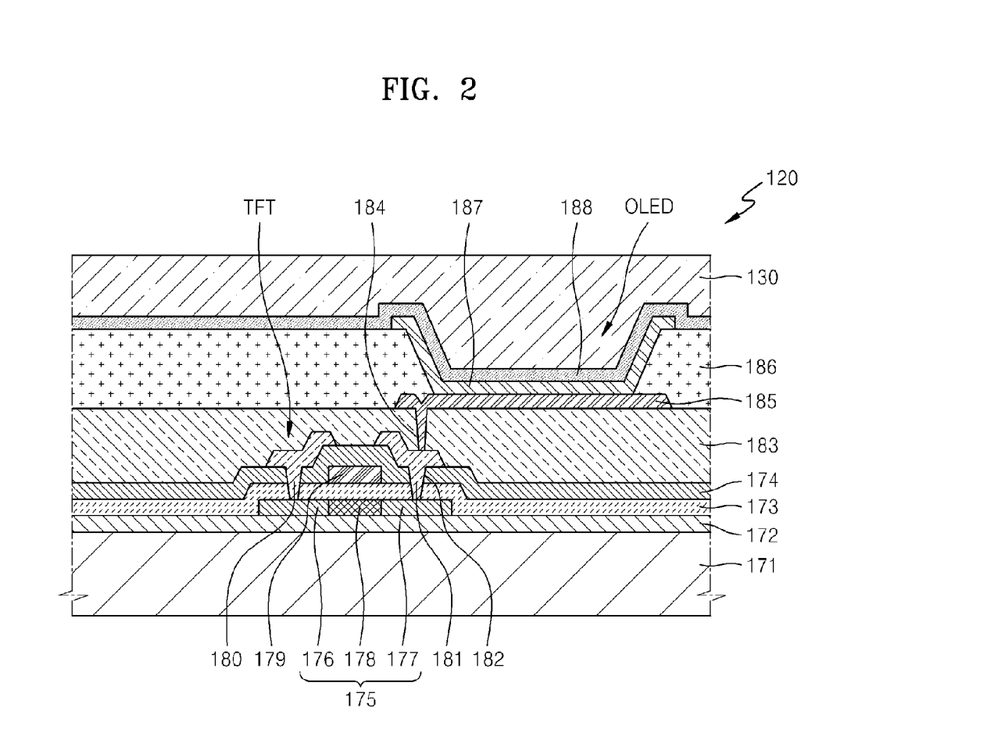
FIG. 2 is a cross-sectional view illustrating a sub-pixel of a display unit of FIG. 1.

FIG. 2 is a cross-sectional view illustrating a sub-pixel of the display unit 120 of FIG. 1.

Referring to FIG. 2, the display unit 120 includes a flexible substrate 171. In some embodiments, the flexible substrate 171 may be formed of a flexible material. For example, the flexible substrate 171 may be formed of a polymer material including polyimide (PI), polycarbonate (PC), polyethersulfone (PES), polyethylene terephthalate (PET), polyethylene naphthalate (PEN), polyarylate (PAR), fiber glass reinforced plastic (FRP), and the like.

In some embodiments, the flexible substrate 171 is a thin-film layer that completely covers the mother substrate 110 of FIG. 1. In some embodiments, if the flexible substrate 171 has a sufficient thickness to support weights of devices and thin-film layers which are formed thereon, the flexible substrate 171 may replace the mother substrate 110.

A first insulating layer 172 that corresponds to a barrier layer is formed on the flexible substrate 171. In some embodiments, the first insulating layer 172 completely covers the flexible substrate 171. In some embodiments, the first insulating layer 172 may include an inorganic material, such as silicon oxide ($SiO_x$), silicon nitride ($SiN_y$), silicon oxynitride (SiON), aluminum oxide (AlO), aluminum nitride (AlON), or the like, may include an organic material, such as acryl, polyimide, polyester, or the like, or may be formed as a multi-layer stack including the organic material and the inorganic material.

In some embodiments, the first insulating layer 172 shields from oxygen and moisture, prevents moisture or foreign substances from diffusing from the flexible substrate 171, and provides a flat surface on the flexible substrate 171.

A thin-film transistor (TFT) is formed on the first insulating layer 172. In some embodiments, the TFT may be a top gate type TFT. In some embodiments, the TFT may be different types of TFTs, such as a bottom gate type TFT.

In some embodiments, a semiconductor active layer 175, a second insulating layer 173, a gate electrode 179, a third insulating layer 174, a source electrode 180, a drain electrode 181, and a protective layer 183 are formed on the first insulating layer 172 when TFT is a top gate type TFT.

When the semiconductor active layer 175 is formed of polysilicon, the semiconductor active layer 175 may be formed in a manner that amorphous silicon is first formed and then is crystallized into polysilicon.

In some embodiments, the crystallization of the amorphous silicon may be performed by using various methods including a rapid thermal annealing (RTA) method, a solid phase crystallization (SPC) method, an excimer laser annealing (ELA) method, a metal-induced crystallization (MIC) method, a metal-induced lateral crystallization (MILC) method, a sequential lateral solidification (SLS) method, and the like. In some embodiments, in order to apply the flexible substrate 171, it is preferable not to use a crystallization method that does not require a high-temperature heating process to be performed.

In some embodiments, when the crystallization is performed via a low temperature polysilicon (LTPS) process, the semiconductor active layer 175 may be activated by being irradiated a laser for a short time, so that the flexible substrate 171 is not exposed to a high temperature equal to or greater than 300° C., and thus a whole process may be performed at a temperature equal to or less than 300° C. Accordingly, the TFT may be formed by using the flexible substrate 171 that is formed of a polymer material.

In some embodiments, the semiconductor active layer 175 is formed with a source region 176 and a drain region 177 which may be doped with p-type impurity ions. In some embodiments, a channel region 178 that is not doped with an impurity corresponds to a region between the source region 176 and the drain region 177.

The second insulating layer 173 that corresponds to a gate insulating layer is formed on the semiconductor active layer 175. In some embodiments, the second insulating layer 173 may be a single layer including $SiO_2$ or may have a double-layer structure including $SiO_2$ and $SiN_y$. In some embodiments, the second insulating layer 173 may correspond to an entire region of the display unit 120. In some embodiments, the second insulating layer 173 may extend to and thus is formed in the non-display region 122 of FIG. 1. In some embodiments, the second insulating layer 173 may extend to the wire regions 140 of FIG. 1 and thus may be formed on a mother substrate (refer to the mother substrate 110 of FIG. 1). In some embodiments, the second insulating layer 173 may be selectively formed on desired regions of the mother substrate 110.

In some embodiments, the gate electrode 179 may be formed on a predetermined region of the second insulating layer 173. The gate electrode 179 is connected to a gate line (not shown) to apply TFT on/off signals to the TFT. In some embodiments, the gate electrode 179 may be formed of a single metal material or metal materials. For example, the gate electrode 179 may include a single layer structure or a multi-layer structure including Au, Ag, Cu, Ni, Pt, Pd, Al, Mo, Cr, or the like, or may include a metal alloy, such as an Al:Nd alloy, a Mo:W alloy, and the like. The third insulating layer 174 that corresponds to an interlayer insulating layer is formed on the gate electrode 179. In some embodiments, the third insulating layer 174 may be formed of an insulating material, such as $SiO_2$ or $SiN_y$, or an insulating organic material. In some embodiments, the third insulating layer 174 may correspond to an entire region of the display unit 120. That is, the third insulating layer 174 extends to and thus is formed in the non-display region 122 of FIG. 1. In some embodiments, the third insulating layer 174 may also extend to the wire regions 140 of FIG. 1 and thus may be formed on the mother substrate 110 of FIG. 1. In some embodiments, the third insulating layer 174 may be selectively formed on desired regions of the mother substrate 110.

In some embodiments, in the non-display region 122 and the wire regions 140, the flexible substrate 171 is formed on the mother substrate 110, and at least one of the first insulating layer 172, the second insulating layer 173, and the third insulating layer 174 may be stacked on the flexible substrate 171.

The source electrode 180 and the drain electrode 181 are formed on the third insulating layer 174. In some embodiments, by selectively removing portions of the second insulating layer 173 and the third insulating layer 174, contact holes 182 may be formed in the second insulating layer 173 and the third insulating layer 174, so that the source electrode 180 is electrically connected to the source region 176 via the contact hole 182, and the drain electrode 181 is electrically connected to the drain region 177 via the contact hole 182.

The protective layer 183 is formed on the source electrode 180 and the drain electrode 181. In some embodiments, the protective layer may be a passivation layer and/or a planarization layer. In some embodiments, the protective layer 183 protects and planarizes the TFT formed therebelow. The protective layer 183 may be formed in various manners. In some embodiments, the protective layer 183 may be formed of an organic material, such as benzocyclobutene (BCB), acryl, or the like, or an inorganic material, such as $SiN_y$, or the like, and may have one of various structures including a single-layer structure, a double-layer structure, or a multi-layer structure.

A display device is formed on the TFT. In some embodiments, the display device may be formed as an organic light-emitting device (OLED). However, aspects of the present invention are not limited thereto, and various display devices may be used.

In order to form the OLED on the TFT, a first electrode 185 that corresponds to a pixel electrode is electrically connected to one of the source electrode 180 and the drain electrode 181 via a contact hole 184.

In some embodiments, the first electrode 185 may function as an anode electrode between electrodes that are arranged in the OLED and may be formed of various conductive materials. In some embodiments, the first electrode 185 may be formed as a transparent electrode or a reflective electrode according to purpose.

For example, when the first electrode 185 is used as a transparent electrode, the first electrode 185 may include ITO, IZO, ZnO, $In_2O_3$ or the like, and when the first electrode 185 is used as a reflective electrode, the first electrode 185 may be formed in a manner that a reflective layer is formed of Ag, Mg, Al, Pt, Pd, Au, Ni, Nd, Ir, Cr, or compound of any of these, and then ITO, IZO, ZnO, $In_2O_3$, or the like is formed thereon.

In some embodiments, a pixel-defining layer (PDL) 186 that is formed of an organic material and covers edges of the first electrode 185 of the OLED is formed on the protective layer 183. In some embodiments, an organic layer 187 is formed on an exposed portion of the first electrode 185, which is formed by etching a portion of the PDL 186.

In some embodiments, the organic layer 187 is patterned to only correspond to each sub-pixel, i.e., the patterned first electrode 185. However, this structure is for convenience of description and thus the organic layer 187 may be integrally formed with another organic layer 187 of another adjacent sub-pixel. In some embodiments, some layers of the organic layer 187 may be formed to correspond to sub-pixels, respectively, and other layers of the organic layer 187 may be integrally formed with another organic layer 187 of another adjacent sub-pixel.

In some embodiments, the organic layer 187 may be formed as a low molecule organic material layer or a polymer organic material layer.

When the organic layer 187 is formed as a low molecule organic material layer, the organic layer 187 may have a structure in which a hole injection layer (HIL), a hole transport layer (HTL), an emission layer (EML), an electron transport layer (ETL), an electron injection layer (EIL), or the like are singularly or multiply stacked.

In some embodiments, the organic layer 187 may be formed by using one of various organic materials including copper phthalocyanine (CuPc), N,N'-Di(naphthalene-1-yl)-N,N'-diphenyl-benzidine (NPB), tris-8-hydroxyquinoline aluminum)(Alq3), or the like.

When the organic layer 187 is formed as a polymer organic material layer, the organic layer 187 may have a structure including an HTL and an EML. The HTL is formed of PEDOT, and the EML is formed of a polymer organic material including a poly-phenylenevinylene (PPV) material, a polyfluorene material, and the like. The polymer organic material layer may be formed by using a screen printing method, an inkjet printing method, or the like.

However, features of the organic layer 187 are not limited thereto and thus various examples may be applied thereto.

A second electrode 188 that corresponds to a common electrode of the OLED is formed on the organic layer 187.

The first electrode 185 and the second electrode 188 are insulated from each other by the organic layer 187. When a voltage is applied to the first electrode 185 and the second electrode 188, visible rays are emitted from the organic layer 187 so that an image that is recognizable by a user is realized.

Likewise to the first electrode 185, the second electrode 188 may be formed as a transparent electrode or a reflective electrode.

When the second electrode 188 is formed as a transparent electrode, the second electrode 188 may be formed in a manner that a metal material with a low work function, e.g., Li, Ca, LiF/Ca, LiF/Al, Al, Mg, or compound of any of these, is deposited on the organic layer 187, and then a transparent electrode target material including ITO, IZO, ZnO, $In_2O_3$, or the like is formed thereon.

When the second electrode 188 is formed as a reflective electrode, the second electrode 188 may be formed in a manner that Li, Ca, LiF/Ca, LiF/Al, Al, Mg, or compound of any of these is completely deposited.

When the first electrode 185 is formed as a transparent electrode or a reflective electrode, the first electrode 185 may have a shape that corresponds to a shape of an opening of each sub-pixel. In some embodiments, the second electrode 188 may be formed by depositing a transparent electrode or a reflective electrode on an entire surface of the display region 121. In some embodiments, the second electrode 188 may not be deposited on the entire surface and thus may be formed as various patterns. Here, positions of the first electrode 185 and the second electrode 188 may be switched.

The TFE unit 130 is combined on the OLED. In some embodiments, the TFE unit 130 may protect the organic layer 187 and other thin-film layers against exterior moisture or oxygen. In some embodiments, the TFE unit 130 may encapsulate the OLED in a manner that organic and/or inorganic films are formed on the OLED after the OLED is manufactured. In some embodiments, the TFE unit 130 may be formed of the same material as the flexible substrate 171.

In some embodiments, a buffer layer (not shown) may be further formed on one surface of the encapsulation unit 130 which faces the OLED. In some embodiments, the buffer layer may be formed of an inorganic material, such as $SiO_x$, $SiN_y$, SiON, AlO, or AlON, may be formed of an organic material, such as acryl, polyimide, or the like, or may be formed as a multi-layer stack including the organic material and the inorganic material.

Referring back to FIG. 1, the display units 120 that are arrayed at regular intervals on the mother substrate 110 undergo a cutting process so as to be divided into individual display devices.

For the division, first cutting lines 161 and second cutting lines 162 are formed on the mother substrate 110 so that the display units 120 are individually separated along edges of the display units 120. In some embodiments, the first cutting lines 161 and second cutting lines 162 include a plurality of first cutting lines that are formed along opposite edges of the display units 120 in an X-axis direction of the array substrate 100, and a plurality of second cutting lines that are formed along opposite edges of the display units 120 in a Y-axis direction of the array substrate 100.

By using a cutting tool, the array substrate 100 having the aforementioned structure is cut along the first cutting lines 161 so that a group of the display units 120 sequentially arrayed in the X-axis direction is separated, and then the group of display units 120 are cut along the second cutting lines 162 so that the display units 120 are individually separated.

Here, at least one testing wire 150 is formed in the wire region 140 between the adjacent display units 120. There is a limit in decreasing a width of the testing wire 150 due to its electrical characteristic, and also, since the wire region 140 is narrow, a cutting operation is performed while the testing wire 150 overlaps with the first cutting line 161 or the second cutting line 162 on the mother substrate 110.

Here, while or after the display units 120 are divided into individual display devices, an edge crack occurs in the first cutting line 161 or the second cutting line 162 which is formed at an edge of the display unit 120.

After the edge crack occurs, if equipment or a work contacts the array substrate 100 for a flexible display device, the edge crack at a contacted part of the edge of the display unit 120 further rapidly propagates.

In order to prevent the aforementioned problem, in some embodiments, the mother substrate 110 may be formed of a plurality of protective films, and is divided into individual display units by using half cutting and full cutting.

This will now be described below.

Figure 3A:
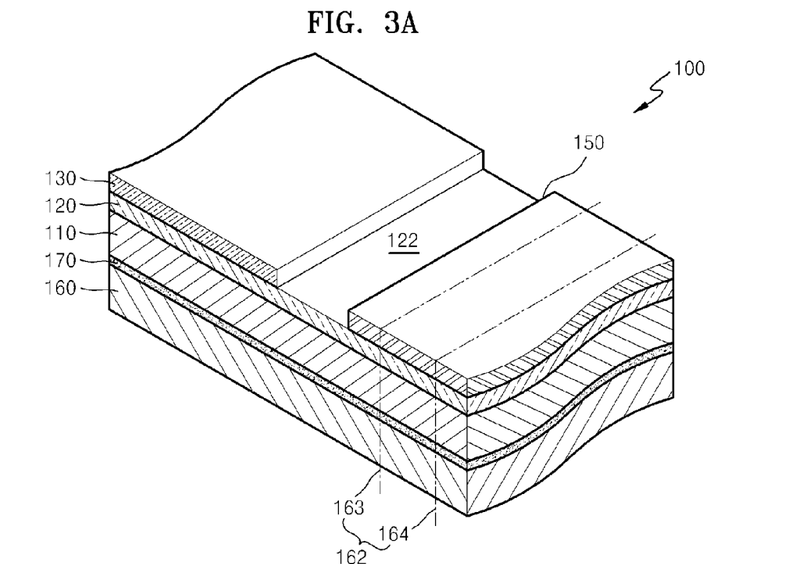
FIG. 3A is a cross-sectional perspective view illustrating a state in which a display unit is formed on a mother substrate.
Figure 3B:
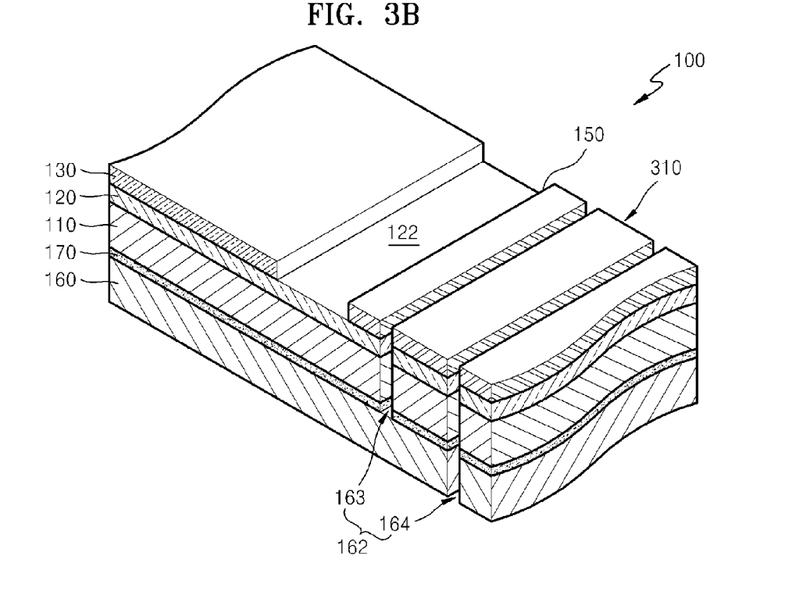
FIG. 3B is a cross-sectional perspective view illustrating a state in which half cutting and full cutting are performed on the mother substrate of FIG. 3A.
Figure 3C:
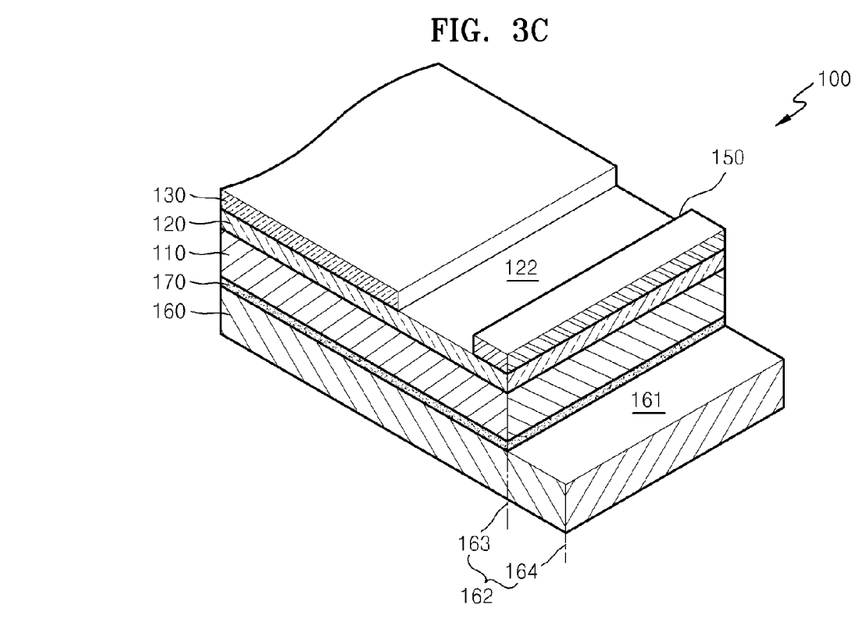
FIG. 3C is a cross-sectional perspective view illustrating a state in which a remaining part on the mother substrate of FIG. 3B is removed.
Figure 3D:
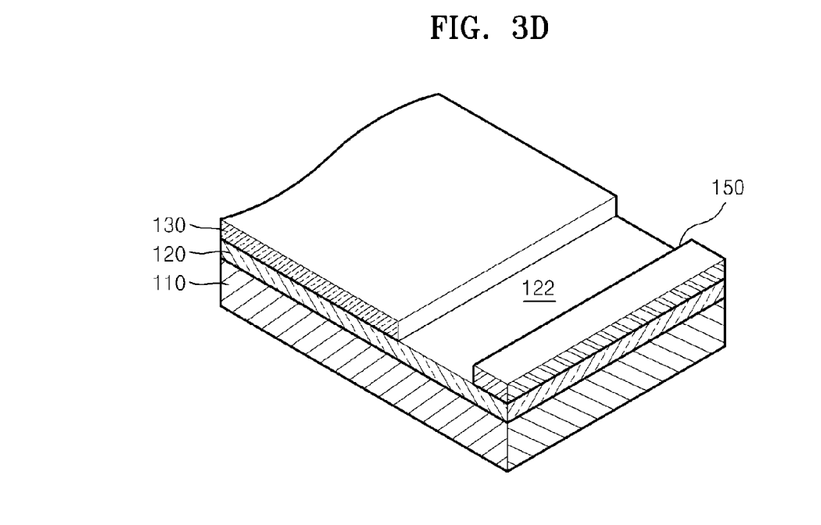
FIG. 3D is a cross-sectional perspective view illustrating a state in which a second lower protective film arranged on the mother substrate of FIG. 3C is removed.

FIGS. 3A through 3D illustrate a process of forming individual display units, according to an aspect of the present embodiments. FIG. 3A is a cross-sectional perspective view illustrating a state in which a display unit is formed on a mother substrate, FIG. 3B is a cross-sectional perspective view illustrating a state in which half cutting and full cutting are performed on the mother substrate of FIG. 3A, FIG. 3C is a cross-sectional perspective view illustrating a state in which a remaining part on the mother substrate of FIG. 3B is removed, and FIG. 3D is a cross-sectional perspective view illustrating a state in which a second lower protective film arranged on the mother substrate of FIG. 3C is removed.

Here, the array substrate 100 for a flexible display device has been cut along the first cutting line 161 in the X-axis direction of FIG. 1.

First, as illustrated in FIG. 3A, the array substrate 100 for a flexible display device is arranged.

The array substrate 100 includes a plurality of lower protective films. The lower protective films include a first lower protective film 110 and a second lower protective film 160. In some embodiments, the first lower protective film 110 and the second lower protective film 160 are formed of a flexible material, such as polymer resin.

In some embodiments, the first lower protective film 110 functions as a mother substrate having a size by which the display units 120 may be simultaneously manufactured.

In some embodiments, the display units 120 are arrayed in one direction on a top surface of the first lower protective film 110. Each of the display units 120 includes the display region 121 and the non-display region 122 that extends from the display region 121 to an edge of the display unit 120. The display region 121 is covered by the TFE unit 130.

A wire region (refer to the wire region 140 of FIG. 1) is formed between a pair of adjacent display units 120. The testing wire 150 having a stripe shape is patterned in the wire region 140. At least one testing wire 150 is formed in one direction of the array substrate 100.

The second lower protective film 160 is attached to a bottom surface of the first lower protective film 110. In some embodiments, the second lower protective film 160 may be attached to the bottom surface of the first lower protective film 110 by using an adhesion layer 170. In some embodiments, the adhesion layer 170 may be formed of a material having low adhesion so as to facilitate easy detachment of the display units 120.

In some embodiments, the adhesion layer 170 may be separately arranged, and then may be interposed between the first lower protective film 110 and the second lower protective film 160 or may be coated in a liquid state on at least one of the bottom surface of the first lower protective film 110 and a top surface of the second lower protective film 160 of FIG. 3A. In some embodiments, the adhesion layer 170 may be coated on the top surface of the second lower protective film 160.

In order to individually divide the display units 120, the second cutting line 162 is formed on the first lower protective film 110 along the Y-axis direction of FIG. 1. The second cutting line 162 includes a half cutting line 163 that is formed along an edge of the display unit 120 so as to separate the display unit 120, and a full cutting line 164 that is arranged in the wire region 140 between the pair of adjacent display units 120. The half cutting line 163 corresponds to the edge of the display unit 120.

Although not illustrated, in some embodiments of the manufacturing method, at least one upper protective film may be further attached to a top surface of the display unit 120 so as to protect the TFE unit 130, the display unit 120, and the testing wire 150.

Referring to FIG. 3B, by performing half cutting and full cutting on the first lower protective film 110, the display units 120 are individually divided.

In some embodiments, the half cutting is performed along the half cutting line 163 that is formed along the edge of the display unit 120. In some embodiments, the half cutting is performed in a manner that a cutting tool cuts the array substrate 100 in a thickness direction from the top surface of the display unit 120 to the bottom surface of the first lower protective film 110. In some embodiments, the second lower protective film 160 is not cut.

In some embodiments, since the half cutting line 163 is formed in a region in which a portion of the display unit 120 overlaps with a portion of the testing wire 150, the half cutting crosses the portion of the testing wire 150. In some embodiments, the testing wire 150 may be formed in an outer region of the half cutting line 163, which is outside a region in which the TFE unit 130 is formed, since the wire region 140 has a small width, and if the width of the wire region 140 is further decreased, an electrical characteristic deteriorates, resulting in an increase of resistance of the testing wire 150, and thus, the portion of the testing wire 150 overlaps the half cutting line 163.

The full cutting is performed along the full cutting line 164 formed in the wire region 140. In some embodiments, the full cutting is performed in a manner that a cutting tool cuts the array substrate 100 in a thickness direction from a top surface of the testing wire 150 to a bottom surface of the second lower protective film 160.

As described above, in some embodiments of a cutting process, the half cutting is performed on the array substrate 100 in the thickness direction from the top surface of the display unit 120 to the bottom surface of the first lower protective film 110, and the full cutting is performed so that the array substrate 100 is completely cut in the thickness direction to the bottom surface of the second lower protective film 160.

In some embodiments, after the half cutting and the full cutting are performed, a remaining part 310 that is on the second lower protective film 160 and that corresponds to a region between the half cutting line 163 and the full cutting line 164 is removed. Since a bottom surface of the remaining part 310 is attached to the second lower protective film 160 by using the adhesion layer 170 having low adhesion, the remaining part 310 may be easily removed.

In some embodiments, after the remaining part 310 is removed, as illustrated in FIG. 3C, a top surface 161 of the second lower protective film 160 is exposed at an outer region of the half cutting line 163.

Next, after the second lower protective film 160 that is attached to the first lower protective film 110 by using the adhesion layer 170 is removed, as illustrated in FIG. 3D, the individual display unit 120 that is covered by the TFE unit 130 is formed on the first lower protective film 110 corresponding to the mother substrate 110.

Figure 4A:
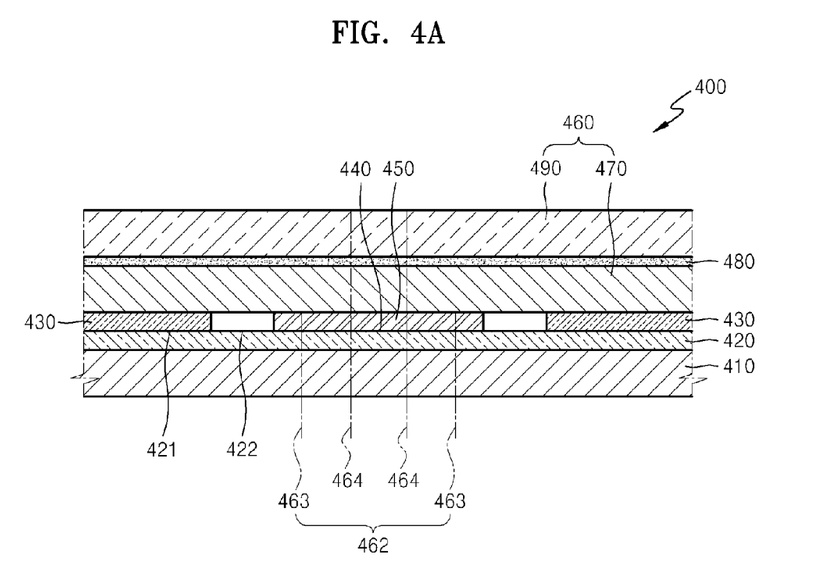
FIG. 4A is a cross-sectional perspective view illustrating a state in which an upper protective film is formed on a mother substrate.
Figure 4B:
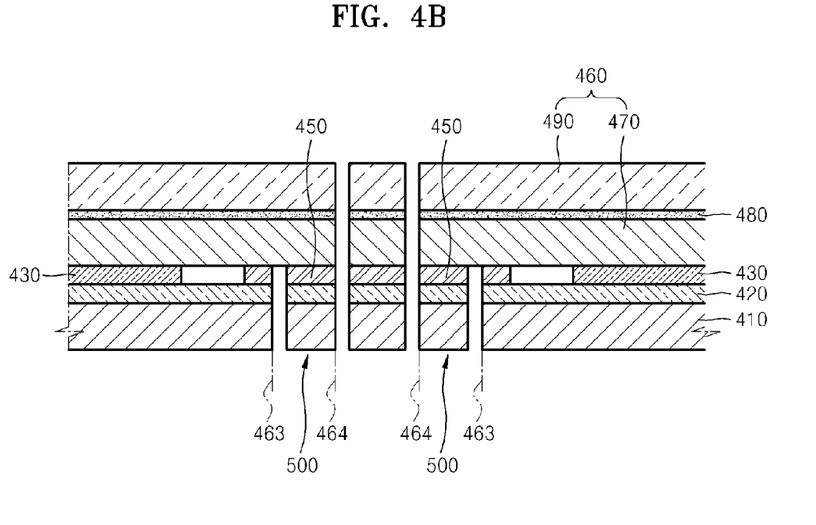
FIG. 4B is a cross-sectional perspective view illustrating a state in which half cutting and full cutting are performed on the mother substrate of FIG. 4A.
Figure 4C:
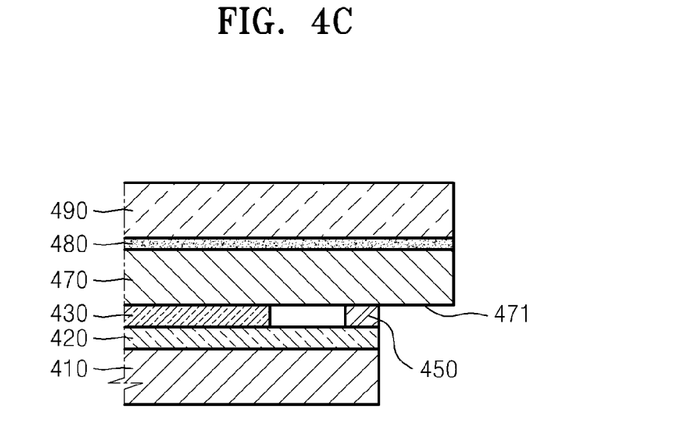
FIG. 4C is a cross-sectional perspective view illustrating a state in which a remaining part on the mother substrate of FIG. 4B is removed.
Figure 4D:
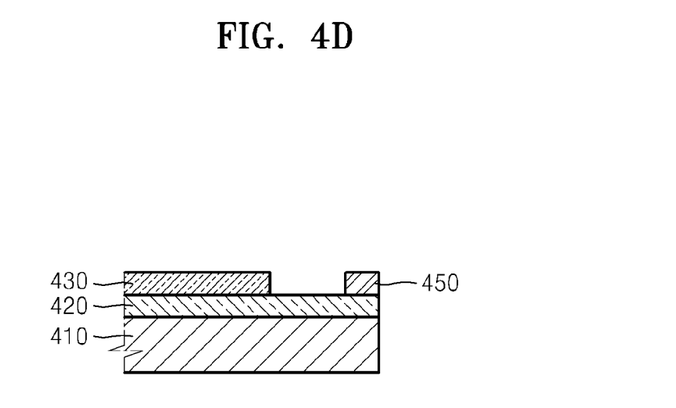
FIG. 4D is a cross-sectional perspective view illustrating a state in which the upper protective film arranged on the mother substrate of FIG. 4C is removed.

FIGS. 4A through 4D illustrate a process of forming individual display units, according to another embodiment of the present invention. FIG. 4A is a cross-sectional perspective view illustrating a state in which an upper protective film 460 is formed on a mother substrate, FIG. 4B is a cross-sectional perspective view illustrating a state in which half cutting and full cutting are performed on the mother substrate of FIG. 4A, FIG. 4C is a cross-sectional perspective view illustrating a state in which a remaining part 500 on the mother substrate of FIG. 4B is removed, and FIG. 4D is a cross-sectional perspective view illustrating a state in which the upper protective film 460 arranged on the mother substrate of FIG. 4C is removed.

Here, an array substrate 400 for a flexible display device has been first cut in one direction of the array substrate 400, and then is to be cut in another direction so as to be divided into individual display units.

First, as illustrated in FIG. 4A, the array substrate 400 for a flexible display device is arranged.

The array substrate 400 includes a lower protective film 410 and the upper protective film 460. The upper protective film 460 includes a first upper protective film 470 and a second upper protective film 490. In some embodiments, the lower protective film 410, the first upper protective film 470, and the second upper protective film 490 are formed of a flexible material, such as polymer resin.

In some embodiments, the lower protective film 410 functions as a mother substrate having a size by which a plurality of display units 420 may be simultaneously manufactured.

The display units 420 are arrayed in one direction on a top surface of the lower protective film 410. Each of the display units 420 includes a display region 421 and a non-display region 422 that extends from the display region 421 to an edge of the display unit 420. The display region 421 is covered by a TFE unit 430.

A wire region 440 is formed between a pair of adjacent display units 420. A testing wire 450 having a stripe shape is patterned in the wire region 440. At least one testing wire 450 is formed in one direction of the array substrate 400.

Although not illustrated, a semiconductor active layer, a gate electrode, source and drain electrodes, and an insulating layer to insulate them from each other are formed in the display region 421, and one or more insulating layers that correspond to the insulating layer are stacked in the non-display region 422 and in the wire region 440 so as to insulate devices in the display region 421. Also, it may be preferable in the manufacturing method that the testing wire 450 is formed together with the gate electrode or the source and drain electrodes on the one or more insulating layers when the gate electrode or the source and drain electrodes are formed.

In some embodiments, the first upper protective film 470 is formed on the display unit 420 that is covered by the TFE unit 430, to decrease damage to the display unit 420 in a cutting process.

The second upper protective film 490 is attached to a top surface of the first upper protective film 470. In some embodiments, the second upper protective film 490 may be attached to the top surface of the first upper protective film 470 by using an adhesion layer 480. In some embodiments, the adhesion layer 480 may be formed of a material having low adhesion so as to facilitate easy detachment of the display units 420. Although not illustrated, an adhesion layer may be formed on a bottom surface of the first upper protective film 470 so as to allow separation between the first upper protective film 470 and the display unit 420 that is covered by the TFE unit 430.

In some embodiments, the adhesion layer 480 may be separately arranged, and then may be interposed between the first upper protective film 470 and the second upper protective film 490 or may be coated in a liquid state on at least one of the top surface of the first upper protective film 470 and a bottom surface of the second upper protective film 490 of FIG. 4A.

In order to individually divide the display units 420, a cutting line 462 is formed on the lower protective film 410. The cutting line 462 includes a half cutting line 463 that is formed along an edge of the display unit 420 so as to separate the display unit 420, and a full cutting line 464 that is arranged in the wire region 440 between a pair of adjacent display units 420. The half cutting line 463 corresponds to the edge of the display unit 420.

After the array substrate 400 is formed, as illustrated in FIG. 4B, by performing half cutting and full cutting on the lower protective film 410, the display units 420 are individually divided. For convenience of description, in some embodiments, the lower protective film 410 may be positioned at a lower side of FIG. 4B, but in the actual cutting process, it is preferable that the lower protective film 410 is positioned at an upper side of FIG. 4B by turning the array substrate 400 upside down.

The half cutting is performed along the half cutting line 463 that is formed along the edge of the display unit 420. In some embodiments, the half cutting is performed in a manner that a cutting tool cuts the array substrate 400 in a thickness direction from the top surface of the lower protective film 410 to a top surface of first upper protective film 470. The first upper protective film 470 and the second upper protective film 490 are not cut.

Here, since the half cutting line 463 overlaps with a portion of the testing wire 450, the half cutting crosses the portion of the testing wire 450.

The full cutting is performed along the full cutting line 464 formed in the wire region 440. In some embodiments, the full cutting is performed in a manner that a cutting tool cuts the array substrate 400 in a thickness direction from the top surface of the lower protective film 410 to a bottom surface of the second upper protective film 490.

As described above, in some embodiments of the cutting process, the half cutting is performed on the array substrate 400 in the thickness direction from the top surface of the lower protective film 410 to the top surface of the first upper protective film 470, and the full cutting is performed so that the array substrate 400 is completely cut in the thickness direction to the bottom surface of the second upper protective film 490.

After the half cutting and the full cutting are performed, is some embodiments the remaining part 500 that is on the first upper protective film 470 and that corresponds to a region between the half cutting line 463 and the full cutting line 464 is removed. Since a bottom surface of the remaining part 500 is attached to the first upper protective film 470 by using an adhesion layer (not shown) that is weak to a mechanical contact or that has low adhesion, the remaining part 500 may be easily removed.

After the remaining part 500 is removed, as illustrated in FIG. 4C, a top surface 471 of the first upper protective film 470 is exposed at an outer region of the half cutting line 463.

Next, in some embodiments the second upper protective film 490 that is attached to the first upper protective film 470 by using the adhesion layer 480 may be removed in a following process, such as an auto view test (AVT), and the second upper protective film 490 is removed in a following process for attachment of a polarizing plate. Then, as illustrated in FIG. 4D, the individual display unit 420 that is covered by the TFE unit 430 is formed on the lower protective film 410 corresponding to the mother substrate.

As described above, some embodiments provide an array substrate for a flexible display device and the method of manufacturing the array substrate, the lower protective film configured as the mother substrate is formed of a plurality of films, and a cutting process is performed by using half cutting and full cutting, so that a contact between the array substrate and equipment or a worker may be maximally decreased. Accordingly, it is possible to prevent propagation of an edge crack.

Also, since the upper protective film that is on the display units arrayed on the mother substrate may be formed of a plurality of films, and a cutting process is performed by using half cutting and full cutting, it is possible to minimize propagation of an edge crack.

While the present embodiments have been particularly shown and described with reference to exemplary embodiments thereof, it will be understood by those of ordinary skill in the art that various changes in form and details may be made therein without departing from the spirit and scope of the present embodiments as defined by the following claims.

What is claimed is:

1. A method of manufacturing an array substrate for a flexible display device, the method comprising:
    arranging at least one lower protective film, wherein a plurality of display units that are covered by thin-film encapsulation (TFE) units are arrayed on the at least one lower protective film;
    performing half cutting and full cutting on the at least one lower protective film to provide remaining parts on the at least one lower protective film; and
    removing the remaining parts on the at least one lower protective film from the half cutting and full cutting.

2. The method of claim 1, wherein the arranging of the at least one lower protective film comprises arranging a first lower protective film on which the plurality of display units are arrayed and a second lower protective film that is attached to the first lower protective film by using an adhesion layer.

3. The method of claim 2, further comprising:
    arraying the plurality of display units at regular intervals on the first lower protective film, wherein each of the plurality of display units comprises a display region and a non-display region; and forming a plurality of testing wires in a wire region between adjacent display units of the plurality of display units, wherein the plurality of testing wires are electrically connected to the adjacent display units, respectively.

4. The method of claim 3, wherein the performing of the half cutting and full cutting comprises:
performing the half cutting along a half cutting line whereby the plurality of display units are individually divided along edges of the plurality of display units; and
performing the full cutting along a full cutting line in the wire region between the adjacent display units.

5. The method of claim 4, wherein:
the half cutting is performed from a top surface of each of the plurality of display units to a bottom surface of the first lower protective film in a half-cut region, and
the full cutting is performed from a top of the plurality of testing wires to a bottom surface of the second lower protective film in a full-cut region.

6. The method of claim 5, wherein:
the full cutting line overlaps with the plurality of testing wires, and
the half cutting line crosses a portion of the plurality of testing wires.

7. The method of claim 5, wherein, after the half cutting and full cutting are performed, a remaining part on the second lower protective film in a region between the half-cut region and the full-cut region is removed.

8. The method of claim 7, wherein the second lower protective film is detached from the first lower protective film whereby each of the plurality of display units is completely manufactured.

9. The method of claim 2, wherein the first lower protective film and the second lower protective film comprise a flexible material.

10. The method of claim 1, further comprising arranging a first upper protective film that is arranged on a top surface of the plurality of display units in an opposite direction to the at least one lower protective film, and a second upper protective film that is attached to the first upper protective film by using an adhesion layer.

11. The method of claim 10, further comprising:
arraying the plurality of display units at regular intervals on the at least one lower protective film, wherein each of the plurality of display units comprises a display region and a non-display region;
forming a plurality of testing wires in a wire region between adjacent display units of the plurality of display units, wherein the plurality of testing wires are electrically connected to the adjacent display units, respectively;
attaching the first upper protective film to the top surface of the plurality of display units covered by the TFE units; and
attaching the second upper protective film to a top surface of the first upper protective film.

12. The method of claim 11, wherein the performing of the half cutting and full cutting comprises:
performing the half cutting along a half cutting line whereby the plurality of display units are individually divided along edges of the plurality of display units in a half-cut region; and
performing the full cutting along a full cutting line in the wire region between the adjacent display units in a full-cut region.

13. The method of claim 12, wherein:
the half cutting is performed from a top surface of the at least one lower protective film to the top surface of the first upper protective film, and
the full cutting is performed from the top surface of the at least one lower protective film to a bottom surface of the second upper protective film.

14. The method of claim 13, wherein:
the full cutting line overlaps with the plurality of testing wires, and
the half cutting line crosses a portion of the plurality of testing wires.

15. The method of claim 13, further comprising removing a remaining part on the first upper protective film, in a region between the half-cut region and the full-cut region.

16. The method of claim 15, wherein the second upper protective film is detached from the first upper protective film whereby each of the plurality of display units is completely manufactured.

17. The method of claim 11, wherein the first upper protective film, the second upper protective film, and the at least one lower protective film comprise a flexible material.

* * * * *